United States Patent [19]
Tominaga

[11] Patent Number: 5,525,840
[45] Date of Patent: Jun. 11, 1996

[54] SEMICONDUCTOR DEVICE HAVING AN ALIGNMENT MARK

[75] Inventor: Makoto Tominaga, Tokyo, Japan

[73] Assignee: NEC Corporation, Tokyo, Japan

[21] Appl. No.: 338,207

[22] Filed: Nov. 9, 1994

[30] Foreign Application Priority Data

Nov. 18, 1993 [JP] Japan .................................. 5-312724

[51] Int. Cl.⁶ ................................................ H01L 23/544
[52] U.S. Cl. .......................................... 257/797; 437/924
[58] Field of Search ............................. 257/797; 437/924

[56] References Cited

U.S. PATENT DOCUMENTS

| | | | |
|---|---|---|---|
| 4,893,163 | 1/1990 | Rudeck | 257/797 |
| 4,981,529 | 1/1991 | Tsujita | 148/33 |
| 5,405,810 | 4/1995 | Mizuno et al. | 437/924 |

FOREIGN PATENT DOCUMENTS 5-152184  6/1993  Japan ..................................... 437/924

OTHER PUBLICATIONS

S. Murakami et al., "Laser Step Alignment For A Wafer Stepper," *SPIE vol. 538 Optical Microlithography IV* (1985), pp. 9–15.

N. Magome et al., "Laser Alignment Signal Simulation For Analysis of Al Layers," *SPIE vol. 1088 Optical/Laser Microlithography II* (1989), pp. 238–247.

*Primary Examiner*—Jerome Jackson, Jr.
*Assistant Examiner*—John Guay
*Attorney, Agent, or Firm*—Popham, Haik, Schnobrich & Kaufman, Ltd.

[57] ABSTRACT

A semiconductor device has an alignment mark formed as a diffraction grating which comprises a plurality of unit markers arranged so that the period P of the diffraction grating is 8 μm. The length $d_1$ of each unit marker in the scanning direction of a laser beam is 4 μm while the length L thereof in a direction perpendicular to the scanning direction is 4 μm. Each unit marker comprises nine unit segments each of 0.8 μm×0.8 μm in size and arranged in an array of 3×3. Submicron openings constituting an unit segment has a small size for sufficiently filling the openings with deposited metal. An accurate alignment can be obtained by the alignment mark in an optical stepper for manufacturing semiconductor devices.

2 Claims, 9 Drawing Sheets

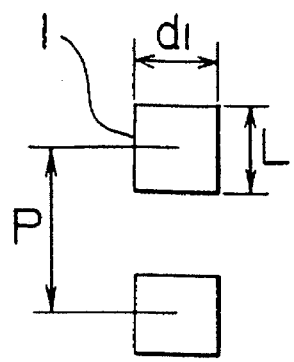
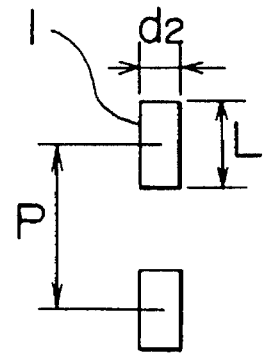
PRIOR ART
FIG. 2A
PRIOR ART
FIG. 2B
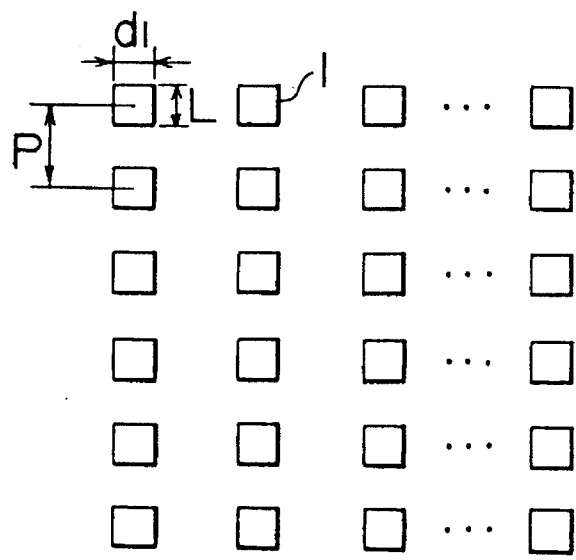
PRIOR ART
FIG. 2C

SEMICONDUCTOR DEVICE HAVING AN ALIGNMENT MARK

BACKGROUND OF THE INVENTION (a) Field of the Invention

The present invention relates to a semiconductor device having an alignment mark thereon and, more particularly, to a semiconductor device having an alignment mark for positioning the wafer during patterning circuit patterns in the semiconductor device.

(b) Description of Related Art

Reduction projection aligners have been widely used in manufacturing semiconductor devices. Methods of alignment used in a reduction projection aligners are roughly classified into two categories. A video image is utilized in methods of one category while diffracted light is utilized in methods of the other category. The present invention relates to the latter.

A conventional alignment method utilizing diffracted light is described in Proc. SPIE, Vol. 538, pp. 9–16 (1985) presented by Murakami et al. FIG. 1A is a schematic side view showing an optical system of the alignment apparatus as described in the document mentioned above while FIG. 1B is a plan view of an alignment mark shown in FIG. 1A. As shown in FIG. 1A, the alignment mark 11 is formed on a wafer 10, above which a reticle 12 is disposed. On one side of the reticle 12, a He—Ne laser unit 13 is disposed. The cross-section of a laser beam emitted from the laser unit 13 is transformed into a long elliptical profile by a lens system 14, then projected on the wafer 10 through a beam splitter 15, a mirror 16 and a projection lens 17.

The alignment mark 11 formed on the wafer 10 is comprised of square shaped unit markers 1 which are aligned in a single line at a pitch or period P. The wafer 10 is fixed to an unillustrated stage whose position is detected at any time. The alignment mark 11 is passed under the exposure of a laser beam 21 by moving the stage. Diffracted light is generated by the alignment mark 11 at that time and propagates in the opposite direction along the path of the laser beam to enter a spatial filter 18 after reflected by the beam splitter 15. After the zeroth order component of the diffracted light is removed by the spatial filter 18, the diffracted light enters a photo-sensor 19, wherein the diffracted light is converted into an electrical signal. The signal is then input into a signal processing unit 20 to be processed.

The position of the wafer 10 is detected relative to the stage in the moving direction of the stage through detecting the position where the alignment mark 11 passes under the laser beam 21. In a similar way, it is possible to form another alignment mark for detecting the position of the wafer 10 in a second direction perpendicular to the aforementioned direction. In this case, another alignment mark is formed perpendicularly to the above-described alignment mark, and the stage is moved in the second direction to allow the alignment mark to pass under the laser beam, whereby the position of the wafer in the second direction is detected.

Next, conventional patterns of the alignment mark will be described with reference to FIGS. 2A–2C. A pattern shown in FIG. 2A is one described by Murakami et al. and corresponds to the pattern shown in FIG. 1B. Although the actual number of unit marker 1 is seven, only five of them are illustrated in FIG. 2A to save space. In this example, unit marker 1 of 4 μm×4 μm in size (i.e. $d_1$=4 μm and L=4 μm in the drawing) are aligned in a single line so that the pitch P is 8 μm. Here, each unit marker 1 is formed such that the length L of the unit marker in the direction in which the unit markers are aligned (hereinafter referred to as "column direction") becomes a half of the pitch P of the main diffraction grating to intensify the ±1st order components of the diffracted light as much as possible when the laser beam is projected.

FIG. 2B shows a second example of diffraction grating described in Proc. SPIE, Vol. 1088, pp. 238–247 (1989) reported by Magome et. al. In the first example, the length $d_1$ of each unit marker in the direction of scanning a laser beam (referred to as a "scanning direction" hereafter) is equal to the length L in the column direction, i.e., 4 μm whereas in the second example, unit marker 1 each of 2 μm×4 μm in size are disposed at a pitch P of 8 μm. It is described by Magome et al. that a more accurate measurement can be obtained by reducing the length $d_2$ in the scanning direction down to 2 μm.

Nobutake et al. also shows a configuration in which a plurality of diffraction gratings (for example, seven) each having the layout shown in. FIG. 2A are disposed in the scanning direction as can be seen from FIG. 2C. When such a configuration is adopted, the positions of the diffraction gratings are all measured by successive laser scanning of the diffraction gratings, and the measured positions are averaged to obtain a more accurate position of the wafer.

Next, a description will be given for a conventional method for forming an alignment mark during a process in which interconnection patterns of a semiconductor device are also formed. Outline is such that contact holes are formed in an interlayer insulation film in an active element region. Subsequently, tungsten plugs are deposited in the contact holes followed by a step in which interconnection patterns are formed covering the tungsten plugs. During the pattern formation step, an alignment mark is formed outside the active element region simultaneously with the interconnection pattern formation on the tungsten plugs.

FIGS. 3A–3F show consecutive steps, as outlined above, for forming unit markers (4 μm×4 μm) of the alignment mark as viewed along line B—B' in FIG. 2A.

First, as shown in FIG. 3A, a photoresist 4 is coated to an interlayer insulation film 3 formed on a semiconductor substrate 2. Openings 21 are formed at locations where unit markers of an alignment mark are to be formed. At the same time, in an active element region, openings not shown in the drawing are formed in the photoresist 4 at locations where contact holes are to be formed. Subsequently, using the photoresist 4 as a mask, the interlayer insulation film 3 is etched by RIE (Reactive Ion Etching) using a mixed gas containing $CF_4$ and $CHF_3$ to form openings 22 constituting unit markers (FIG. 3B). At the same time, contact holes are formed in the active element region.

Next, as shown in FIG. 3C, a titanium nitride film 5 having a thickness of about 500 A (angstrom) is formed by sputtering, and a tungsten film 6 having a thickness of about 5000 A is formed over the entire surface by CVD. Subsequently, the whole surface is etched back in a mixed gas containing $SF_6$ and $N_2$. Since each opening 22 of the alignment mark has a relatively large area, the tungsten film 6 is completely removed from the central portion of each opening to leave the lower layer, i.e., the titanium nitride film 5 exposed although the tungsten film 16 remains on the sidewall of the opening. Then an aluminum alloy film 7 is deposited in a thickness of from 0.1 to 1 μm by sputtering. Since the aluminum alloy film 7 does not have sufficient step-coverage characteristics, the aluminum alloy film 7 covers the openings asymmetrically, as shown in FIG. 3E.

Moreover, the profile of the aluminum alloy film 7 covering each opening is irregular, varying from opening to opening.

Next, a photoresist is applied to the surface of the aluminum alloy film 7, then the semiconductor device is aligned using the alignment mark and followed by exposure and development steps. Subsequently, the aluminum alloy film 7 is etched by a mixed gas containing $BCL_3$ and $CL_2$ to form interconnection patterns. At that time, the aluminum alloy film 7 is also removed by etching from the area where the alignment mark exists, and a part of the titanium nitride film 5 on the sidewalls of the openings is also etched as shown in FIG. 3F.

In the above-described conventional alignment marks, each of unit markers constituting a diffraction grating has a relatively large area, for instance, 4×4 μm or 4×2 μm. Accordingly, when contact holes are filled with a metal layer such as tungsten film, the openings for the unit markers cannot be completely filled with the metal layer to leave un-buried portion thereof. If an aluminum alloy film is deposited on such openings during a process step forming interconnection patterns, the aluminum alloy film is asymmetrically formed on the openings as shown in FIG. 3E due to the pool step coverage of aluminum.

Moreover, since the aluminum alloy exhibits a different coverage profile at each unit markers, the regularity of reflected light to be used for alignment is deteriorated. In detail, when alignment is performed in a reduction projection aligner after the application of a photoresist, a He—Ne laser beam is irregularly reflected by the alignment mark. Accordingly, the spatial distribution of the diffracted light randomly varies so that the position of the stage deviates from the original position of the diffraction grating when the sensor attached to the aligner detects the diffracted light, thereby inducing an alignment error. In accordance with the proposal by Magome et al., the above-described problem can be somewhat mitigated by changing the size of each unit markers of a diffraction grating from 4×4 μm to 4×2 μm, as shown in FIG. 2B. However, a satisfactory result cannot be obtained.

In the case where the diffraction grating shown in FIG. 2A was used for alignment of a wafer, the alignment error was 0.7 μm in term of 3σ where σ is a standard deviation of the alignment error. The results are shown in FIG. 5.

In the first conventional example shown in FIGS. 3A–3F in which a titanium nitride film is used as a barrier layer, a part of the titanium nitride film is removed when an aluminum alloy film is removed by etching. Accordingly, tungsten films remaining on the sidewalls of the openings peel off therefrom in a subsequent process and adhere again to an active element region so that circuit patterns are short-circuited thereby. As a result, the device yield rate decreases.

Another conventional example will be described in which a platinum silicide is used as a barrier layer. Similarly to FIGS. 3A–3F, FIGS. 4A–4D show consecutive steps for forming unit markers in the alignment marks as viewed along the line B—B' in FIG. 2A. In this example, openings 23 are formed in an interlayer insulation film 3 on a semiconductor substrate 2 similarly to the process steps shown in FIGS. 3A and 3B. A platinum film 8 is then formed over the entire surface by sputtering as shown in FIG. 4A. Subsequently, a heat treatment is performed at a temperature of some hundreds degrees centigrade to react platinum with silicon at the locations where the platinum film 8 directly contacts the silicon substrate 2, thereby forming a platinum silicide layer 9. The substrate 2 is then immersed into aqua regia to remove unreacted platinum (FIG. 4B).

Then a tungsten film 6 having a thickness of about 5000 A is formed over the entire surface by CVD as shown in FIG. 4C. Subsequently, the whole surface is etched back in a mixed gas containing $SF_6$ and $N_2$. Since the openings of the alignment mark have large areas, the platinum silicide film 9 is exposed to the outside at the central portion of the bottom surface of each opening, as shown in FIG. 4D.

Subsequently, an aluminum alloy film is formed similarly to the conventional example shown in FIGS. 3A–3F, and the patterning of aluminum alloy film is performed using the alignment mark formed as described above.

In the second conventional example shown in FIGS. 4A–4D where a platinum silicide film is used as a barrier layer, the platinum silicide film is exposed through the bottom surfaces of the openings of the alignment mark. Hence, it has a drawback that both an etch-back chamber for removing blanket tungsten and processing equipment used after the etch-back steps are contaminated by the exposed platinum silicide.

SUMMARY OF THE INVENTION

In view of the foregoing, it is an object of the present invention to provide an improved semiconductor device having an alignment mark which can reduce the irregularity of diffracted light caused by the asymmetry of each unit marker of a diffraction grating, thereby increasing accuracy of the positional detection using the alignment mark.

Another object of the present invention is to provide an improved semiconductor device having an alignment mark in which a possibility of short-circuit failures in interconnection pattern can be reduced.

Still another object of the present invention is to provide an improved semiconductor device having an alignment mark which does not contaminate processing equipment during manufacturing of the semiconductor device.

A semiconductor device according to the present invention comprises a semiconductor device comprising a substrate, a layer formed overlying the substrate, and at least one alignment mark having a plurality of unit markers aligned in a first direction in a uniform pitch, each of the unit markers including a plurality of segments formed in said layer.

In the semiconductor device according to the present invention, each unit marker of the diffraction grating serving as an alignment mark is divided into a plurality of segments each having a small area as compared with a unit marker in conventional semiconductor device. Accordingly, each of openings for the segments can be buried in a manufacturing process thereof substantially uniformly by a plug formed from an interconnection layer covering the alignment mark. As a result, the semiconductor device according to the present invention can reduce the disturbance of diffracted light which would be otherwise caused by asymmetry of each unit marker, thereby increasing accuracy of positional detection using the alignment mark.

Also in the present invention, since the cross-sectional area of each segment is small, a metal layer scarcely adheres to the inner sidewalls of the openings for the segments so that peeling-off of the metal layer due to etching of a barrier layer can be reduced. Accordingly, possibility of short-circuit failures caused by metal layer can be reduced, thereby increasing the yield.

Moreover, in the present invention, even if platinum silicide is used for contact layer, it will not be exposed through bottoms of the openings because of the reduced areas of the openings. Accordingly, it is possible to avoid contamination in the process equipment.

Preferably, the segments are implemented by a plurality of unit segments each having a rectangular or square surface and arranged in at least one of the first direction and a second direction perpendicular to the first direction with a uniform space disposed therebetween in each direction.

It is more preferred that the dimension of at least one side of each unit segment is at most 1 μm.

BRIEF DESCRIPTION OF THE DRAWINGS

The above and other objects, features and advantages of the present invention will be more apparent from the following description, taken in conjunction with the accompanying drawings in which:

FIGS. 2A–2C are plan views of conventional alignment marks.

DESCRIPTION OF THE PREFERRED EMBODIMENTS

Figure 6:
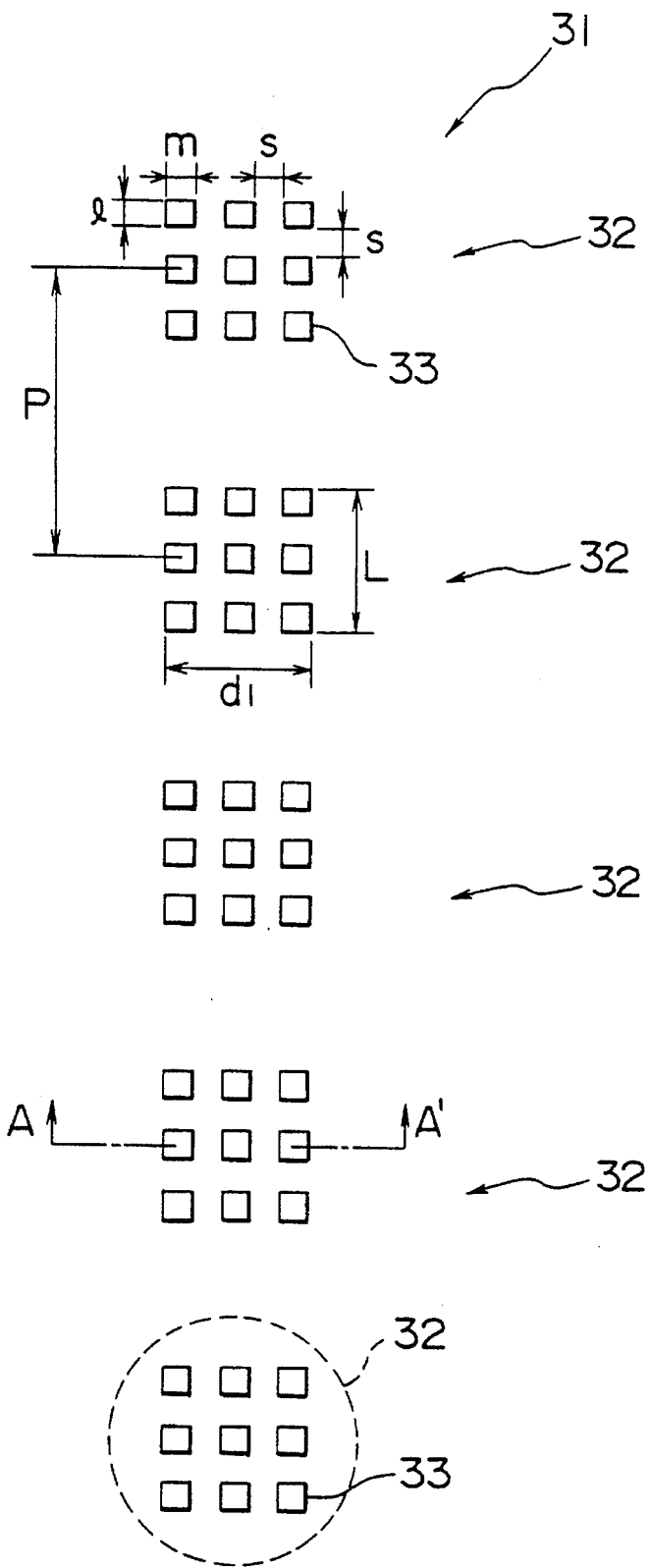
FIG. 6 is a plan view of an alignment mark in a semiconductor device according to a first embodiment of the present invention.

FIG. 6 shows a plan view of an alignment mark in a semiconductor device according to a first embodiment of the present invention. Similarly to the conventional diffraction grating shown in FIG. 2A, the alignment mark of FIG. 6 is composed of a plurality of unit markers 32 which are aligned in a single line at a pitch P of 8 μm. The length $d_1$ of each of the unit markers 32 in a scanning direction of a laser beam is 4 μm while the length L in a column direction of unit markers 32, which is perpendicular to the scanning direction, is 4 μm. Each of the unit markers 32 is composed of nine unit segments 33 which are disposed in an array of 3× 3. The length m of each unit segment 33 in the scanning direction is 0.8 μm while the length 1 in the column direction is 0.8 μm. The space s formed between two adjacent unit segments 33 is 0.8 μm.

The unit segments 33 are formed on the semiconductor substrate as submicron openings, and the area of each submicron opening is selected such that the inside of each submicron opening is mostly filled-up with deposition of a metallic film accompanied with etching thereof.

FIGS. 7A–7F show cross-sectional views of semiconductor device according to the first embodiment of the present invention, as viewed along line A—A' in FIG. 6, during a manufacturing procedure in which tungsten plugs are formed by using titanium nitride in a barrier layer. The steps shown in FIGS. 7A–7F correspond to the conventional steps shown in FIG. 3A–3F.

Figure 7A:
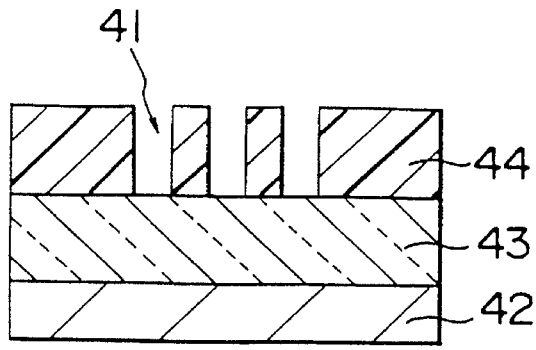
FIGS. 7A–7F are cross-sectional views showing consecutive steps for manufacturing a semiconductor device having the alignment mark shown in FIG. 6.
Figure 7B:
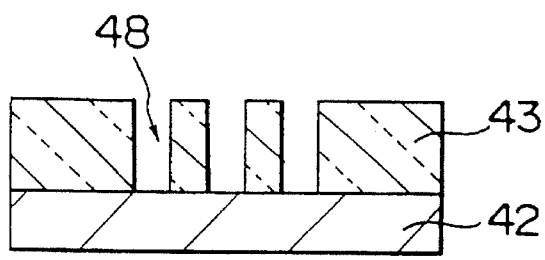
Figure 7C:
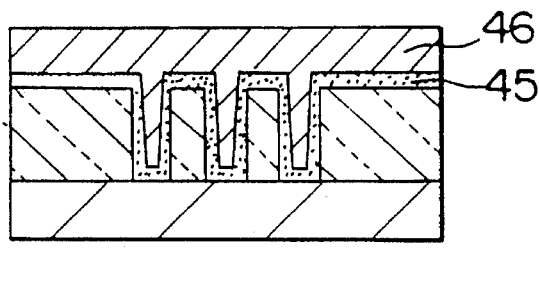

In FIG. 7A, a photoresist 44 is formed on an interlayer insulation film 43 formed on a semiconductor substrate 42 so that the photoresist 44 has openings 41 at locations where minute openings of a submicron order are to be formed (FIG. 7A). Subsequently, using the photoresist 44 as a mask, the interlayer insulation film 43 is etched to form submicron openings 48 constituting unit markers (FIG. 7B).

Figure 7D:
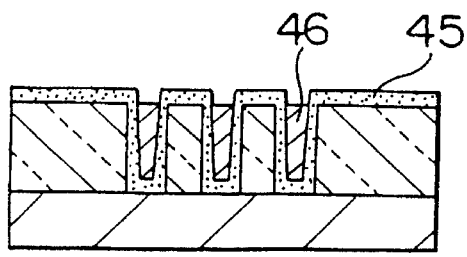
Figure 7E:
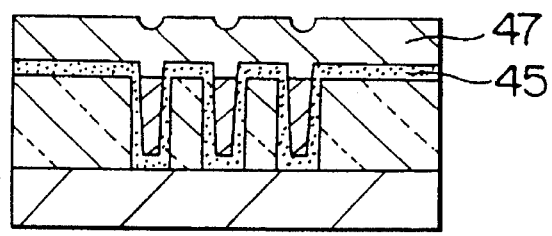
Figure 7F:
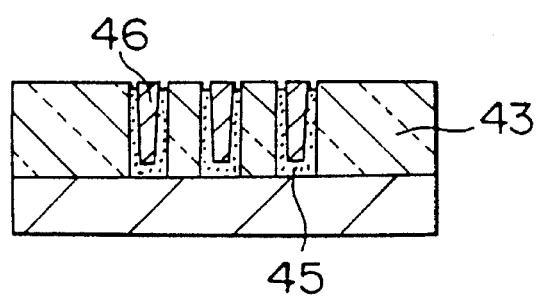

Next, a titanium nitride film 45 having a thickness of about 500 A is formed by sputtering. Subsequently, a tungsten film 46 having a thickness of about 5000 A is formed over the entire surface by CVD (FIG. 7C) and is then etched back. At this time, the surfaces of the tungsten films 46 in the submicron openings 48 are etched back by an excess amount of about 1000–2000 A (FIG. 7D). Subsequently, an aluminum alloy film 47 is formed (FIG. 7E), then subjected to patterning so as to form a interconnection pattern in the active element region (FIG. 7F).

As shown in FIG. 7D, the openings for the alignment mark can be mostly completely filled with the tungsten film or plug 46 because the each unit marker is composed of a set of submicron openings each having a small cross-sectional area. Although a small depression of 1000–2000 A is formed at the upper end of each opening due to overetching of the tungsten film 46, the small depression at the openings can be substantially completely buried by the aluminum alloy film 47 to obtain a satisfactory smooth surfaces of the aluminum alloy films 47. As a result, symmetric depressions can be formed on the surfaces of the aluminum alloy film 47 as shown in FIG. 7E. The depressions have substantially the same profile for all of the unit segments included in the alignment mark as shown in FIG. 7A. Accordingly, when an alignment is performed in an optical stepper after the application of a photoresist on the entire surface shown in FIG. 7E, a diffracted light from the alignment mark exhibits a symmetric spatial distribution. Therefore, the position of the diffraction grating can be measured with a higher accuracy.

Figure 5:
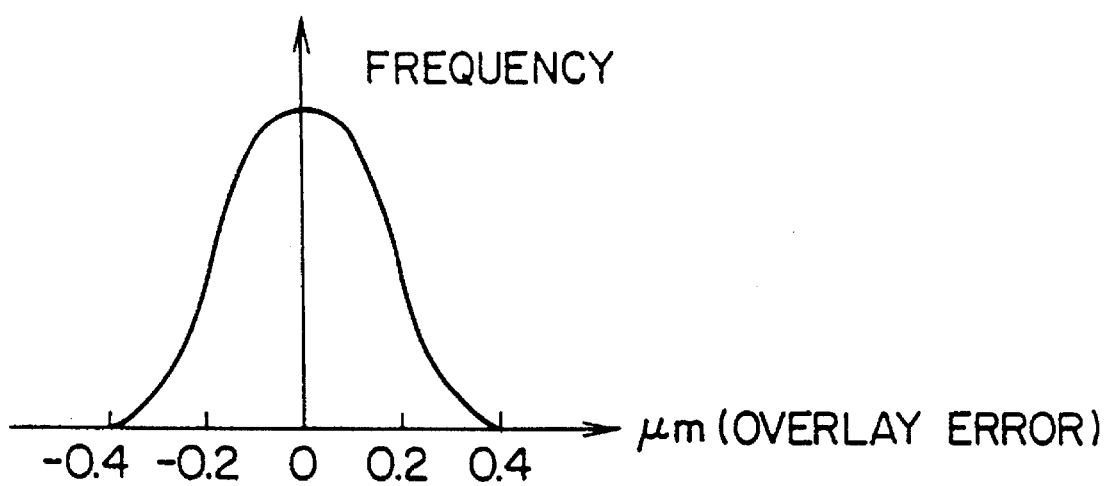
FIG. 5 is a graph showing frequency of an overlay error in the prior art.
Figure 8:
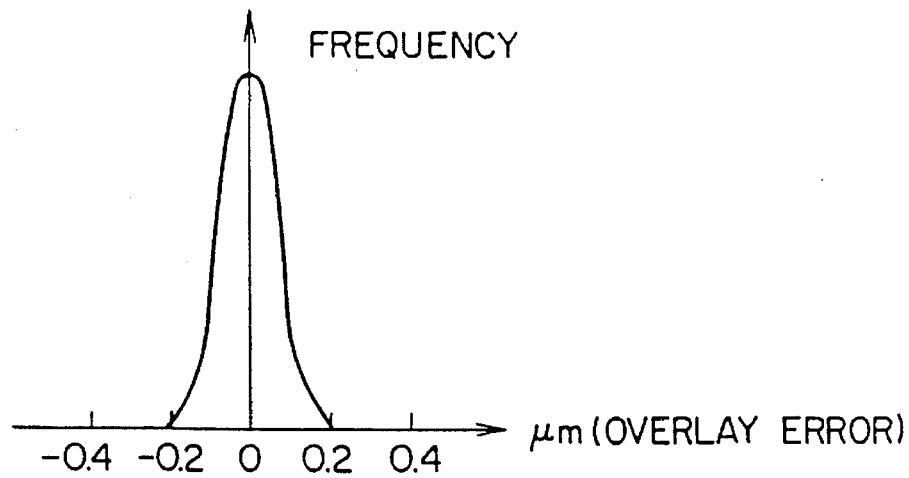
FIG. 8 is a graph showing frequency of an overlay error in the semiconductor device shown in FIGS. 7A–7F.

The alignment error distribution obtained by a stepper using the alignment mark in the present embodiment is shown in FIG. 8. As is understood from FIG. 8, the alignment error is about 0.3 μm in term of 3δ, which is greatly improved from the conventional alignment error of 0.7 μm as described with reference to FIG. 5.

When the aluminum alloy film 47 is patterned to form a interconnection pattern in the active element region and to remove the aluminum alloy film entirely from outside of the active element region, the titanium nitride film 45 under the aluminum alloy film 47 may be slightly etched. In the present embodiment, however, since the tungsten film 46 is sandwiched between the titanium nitride films 45 on both sides thereof, as shown in FIG. 7F, peeling-off of the tungsten film 46 out of the wall can be avoided, thereby reducing defects in which the circuit pattern is short-circuited by the peeled-off tungsten film.

Figure 9A:
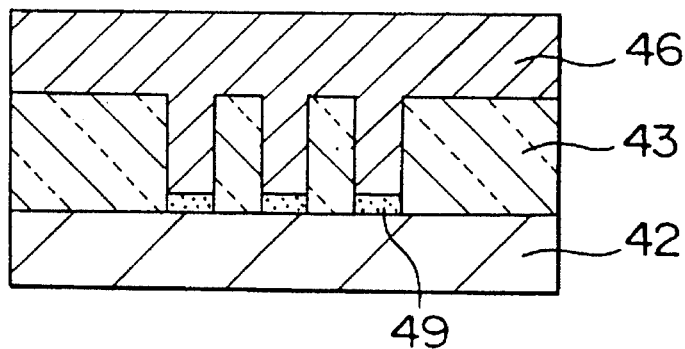
FIGS. 9A and 9B are cross-sectional views showing consecutive steps for manufacturing semiconductor devices having the alignment mark shown in FIG. 6.

Next, a semiconductor device according to a second embodiment having the alignment mark shown in FIG. 6 will be described with reference to FIGS. 9A and 9B. FIGS.

Figure 1A:
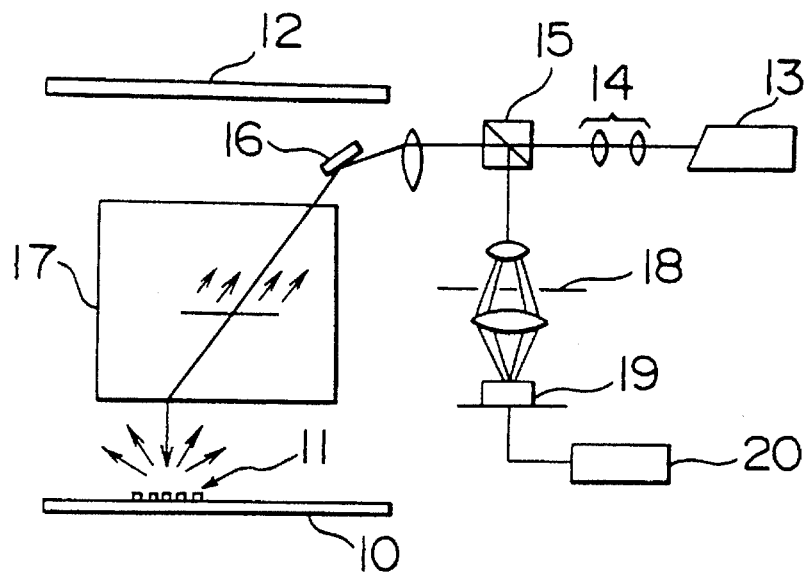
FIG. 1A is a schematic side view showing the structure of an alignment apparatus used in an optical stepper.
Figure 1B:
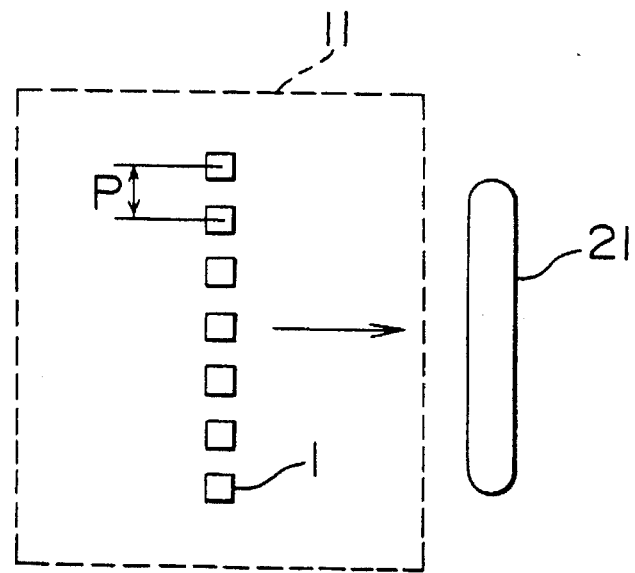
FIG. 1B is a plan view of an alignment mark used in the alignment apparatus shown in FIG.1A.
Figure 3A:
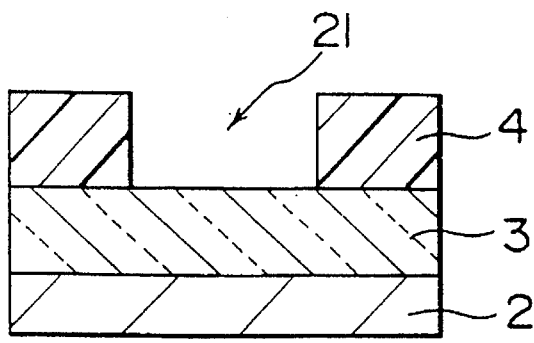
FIGS. 3A–3F are cross-sectional views showing consecutive steps for manufacturing a conventional semiconductor device having an alignment mark.
Figure 3D:
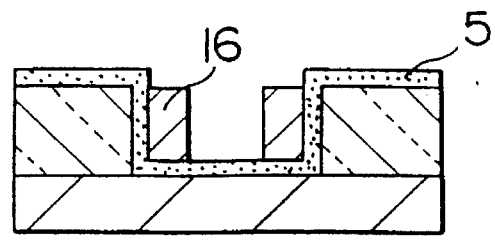
Figure 3B:
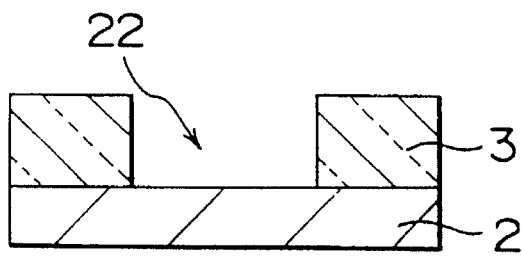
Figure 3E:
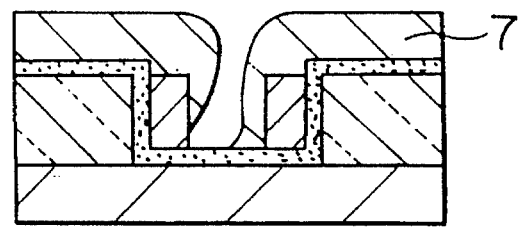
Figure 3C:
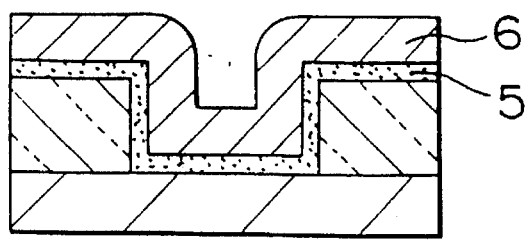
Figure 3F:
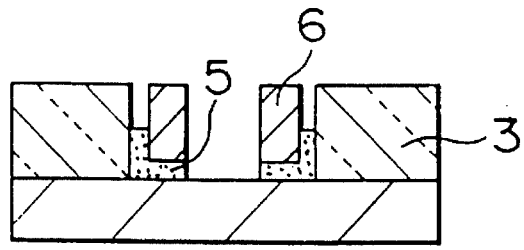
Figure 4A:
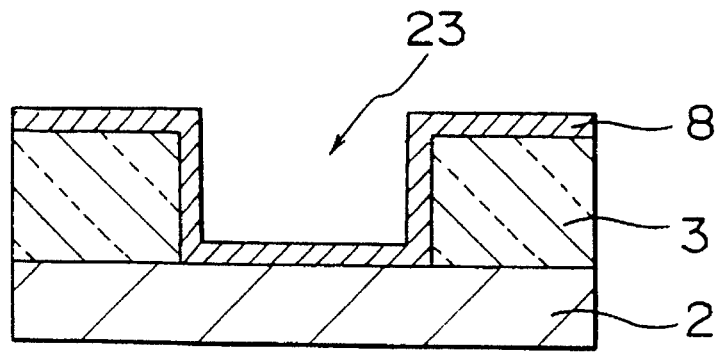
FIGS. 4A–4D are cross-sectional views showing consecutive steps for manufacturing a second conventional semiconductor device having an alignment mark.
Figure 4B:
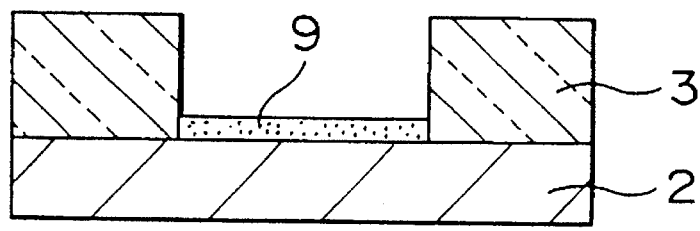
Figure 4C:
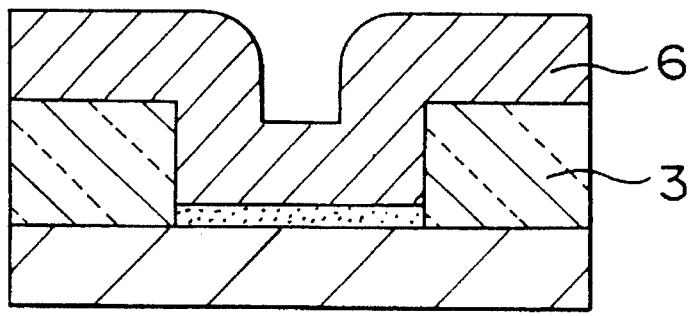
Figure 4D:
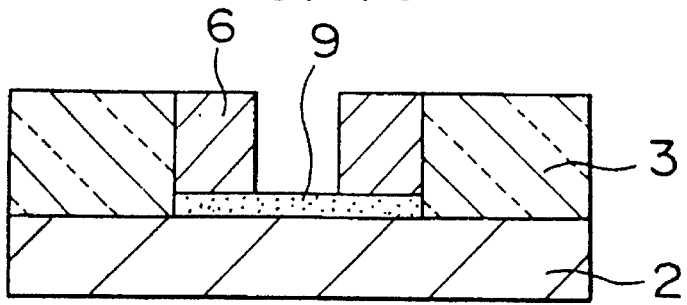

9A and 9B consecutively show steps for manufacturing a semiconductor device, as viewed along the line A—A' in FIG. 6. FIGS. 9A and 9B correspond to the conventional steps shown in FIGS. 4C and 4D.

Submicron openings each serving as a unit segment of a unit marker are formed in an interlayer insulation film 43 on a semiconductor substrate 42, and a platinum silicide film 49 is formed on the bottom surfaces of the submicron openings. Subsequently, a tungsten film 46 is formed over the entire surface (FIG. 9A) and etched back. At this time, the surfaces of the tungsten films 46 in the openings are slightly over-etched by an amount of about 1000–2000 Å (FIG. 9B). Steps following the above-described steps are similar to the steps as shown in FIGS. 7E and 7F.

Figure 9B:
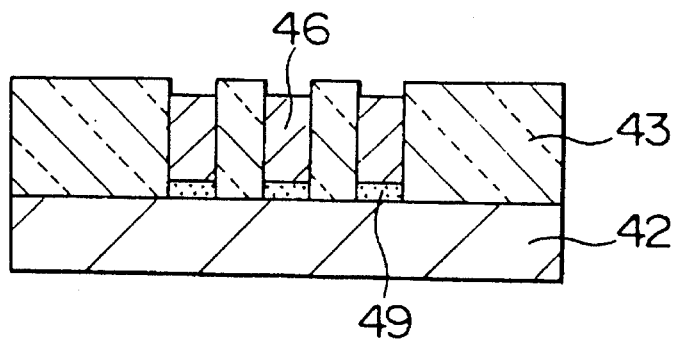

In the manufacturing process as describe above, since the platinum silicide film 49 is not exposed to the outside as shown in FIG. 9B, platinum silicide-induced contamination in the etching chambers and in other processing equipment can be avoided.

Next, alignment marks applicable to semiconductor devices according to another embodiments of the present invention will be described with reference to FIGS. 10A, 10B and 10C.

Figures 10A, 10B, 10C:
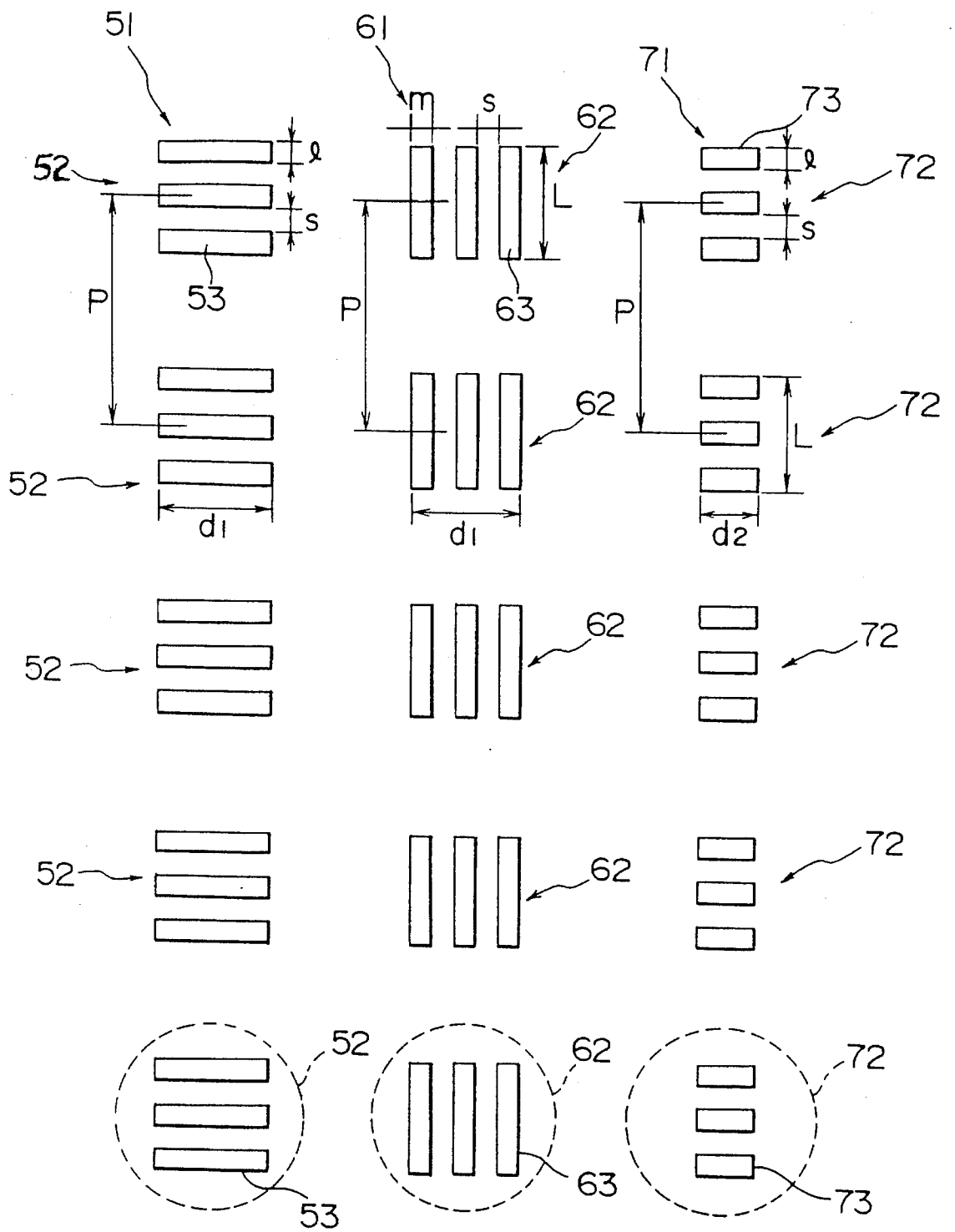
FIGS. 10A–10C are plan views of alignment marks in semiconductor devices according to second, third and fourth embodiments of the present invention.

FIGS. 10A, 10B and 10C are plan views of alignment marks. In FIG. 10A, a plurality of unit markers 52 each of 4 μm×4 μm in size are aligned in a single line so that the pitch P of the main diffraction grating 51 is 8 μm. Each of the unit markers 52 is composed of three unit segments 53 aligned in the column direction in which the unit markers are aligned. The length $d_1$ of each unit segment 53 in the scanning direction is 4 μm while the length 1 of each unit segment 53 in the column direction 0.8 μm. The space "s" formed between two adjacent unit segments 53 is 0.8 μm.

When the alignment mark of FIG. 10A is formed on a semiconductor substrate, each of the submicron openings has a rectangular area, unlike the first embodiment. However, the submicron openings 53 can be substantially completely filled with a metal layer because the width 1 of each submicron opening 53 is narrow, i.e., 0.8 μm. Accordingly, the alignment mark of FIG. 10A achieves advantages similar to those in the first embodiment.

FIG. 10B is a plan view showing an alignment mark 61, in which a plurality of unit markers 62 each of 4 μm×4 μm in size are aligned in a single line so that the period P of the main diffraction gratings 1 is 8 μm. Each of the unit markers 62 are composed of three unit segments 63 aligned in the scanning direction. The length m of each unit segment 63 in the scanning direction is 0.8 μm while the length L of each unit segment 63 in the column direction is 4 μm. The space s formed between two adjacent unit segments 63 is 0.8 μm.

FIG. 10C is a plan view showing still another alignment mark in which a plurality of unit marker 72 are aligned in a single line so that the period P of the main diffraction grating 71 is 8 μm. The length $d_2$ of each unit marker 72 in the scanning direction is 2 μm while the length of the unit marker 72 in the column direction is 4 μm. Each unit marker 72 is composed of three unit segments 73 alined together in the column direction. The length of each unit segment 73 in the scanning direction is 2 μm while the length 1 of each unit segment 73 in the column direction is 0.8 μm. The space s formed between two adjacent unit segments 73 is 0.8 μm.

The alignment marks of FIGS. 10A and 10B correspond to the conventional alignment mark shown in FIG. 2A while the alignment mark of FIG. 10C corresponds to the conventional alignment mark shown in FIG. 2B. The alignment marks of FIGS. 10B and 10C also achieve advantages similar to those in the first embodiment.

Although the preferred embodiments of the present invention are described above, the present invention is not limited to the embodiments since the embodiments may be modified in various ways within the scope of the present invention. For example, although the alignment mark in each of the embodiments is formed as a diffraction grating extending in a single direction, a plurality of diffraction gratings may be arranged also in the scanning direction similarly to the diffraction grating shown in FIG. 2C. In such a case, the position of the corresponding wafer is determined by an average of measured values. Moreover, the dimension and period of the unit markers, or the number, dimension and shape of the unit segments (submicron openings) may be modified in accordance with the manufacturing process of semiconductor devices.

What is claimed is:

1. A semiconductor device, comprising:

a substrate;

a layer formed overlying said substrate; and at least one alignment mark having a plurality of unit markers aligned in a first direction in a uniform pitch, each of said unit markers including a plurality of segments formed in said layer;

wherein each of said segments is implemented by a unit segment arrayed in at least one of said first direction and a second direction perpendicular to said first direction with a uniform space disposed therebetween; and wherein each of said unit segments has a square surface having sides parallel to said first direction or said second direction, and each of said sides is not longer than 1 μm.

2. A semiconductor device comprising:

a substrate;

a layer formed overlying said substrate; and at least one alignment mark having a plurality of unit markers, said unit markers being aligned in a first direction in a uniform pitch corresponding to a wavelength of a laser beam used for aligning said semiconductor device, each of said unit markers including a plurality of segments formed in said overlying layer;

wherein each of said segments is implemented by a unit segment arrayed in at least one of said first direction and a second direction perpendicular to said first direction with a uniform space disposed therebetween;

wherein each of said unit markers has a square area having sides parallel to said first direction or said second direction; and wherein each of said unit segments has a square surface having sides parallel to said first direction or said second direction.

* * * * *